(12) United States Patent
Hashimoto

(10) Patent No.: US 7,125,259 B2
(45) Date of Patent: Oct. 24, 2006

(54) IC SOCKET

(75) Inventor: Shinichi Hashimoto, Kanagawa (JP)

(73) Assignee: Tyco Electronics AMP K.K., Kanagawa-Ken (JP)

( * ) Notice: Subject to any disclaimer, the term of this patent is extended or adjusted under 35 U.S.C. 154(b) by 16 days.

(21) Appl. No.: 11/078,076

(22) Filed: Mar. 11, 2005

(65) Prior Publication Data
US 2005/0202708 A1    Sep. 15, 2005

(30) Foreign Application Priority Data
Mar. 12, 2004    (JP) .............................. 2004-070546

(51) Int. Cl.
*H01R 13/62*    (2006.01)
(52) U.S. Cl. ........................................ 439/73; 439/331
(58) Field of Classification Search ................. 439/71, 439/73, 330, 331
See application file for complete search history.

(56) References Cited
U.S. PATENT DOCUMENTS

| | | | |
|---|---|---|---|
| 6,086,387 A * | 7/2000 | Gallagher et al. ............. | 439/71 |
| 6,174,188 B1 * | 1/2001 | Martucci ..................... | 439/326 |
| 6,203,332 B1 | 3/2001 | Tashiro et al. | |
| 6,722,909 B1 * | 4/2004 | McHugh et al. ............. | 439/331 |
| 6,752,636 B1 * | 6/2004 | Ma .............................. | 439/73 |
| 6,780,024 B1 * | 8/2004 | Ma .............................. | 439/73 |
| 6,799,978 B1 * | 10/2004 | Ma et al. ...................... | 439/73 |
| 6,832,919 B1 * | 12/2004 | Ma et al. ...................... | 439/73 |
| 6,848,929 B1 * | 2/2005 | Ma .............................. | 439/331 |
| 6,872,083 B1 * | 3/2005 | Kanesashi ..................... | 439/73 |
| 6,908,315 B1 * | 6/2005 | Groot .......................... | 439/72 |
| 6,916,195 B1 * | 7/2005 | Byquist ....................... | 439/342 |
| 6,964,573 B1 * | 11/2005 | Asai et al. .................... | 439/71 |

* cited by examiner

*Primary Examiner*—Gary F. Paumen
(74) *Attorney, Agent, or Firm*—Barley Snyder LLC

(57) ABSTRACT

An IC socket that is capable of obtaining stable, reliable electrical connections between an IC package and a socket housing, even in the case that the IC package is placed at a position shifted from a predetermined position on the socket housing then pressed, during connection of the IC package, without grinding down the peripheral wall of a mounting surface, onto which the IC package is mounted. Metal plates, for guiding the IC package, are provided on at least a portion of the peripheral wall that surrounds the mounting surface of the socket housing. The metal plates are of a shape such that they are coplanar with or protrude upward from an upper surface of the peripheral wall, and such that they are coplanar with or protrude inward from an inner surface of the peripheral wall.

9 Claims, 5 Drawing Sheets

IC SOCKET

FIELD OF THE INVENTION

The present invention relates to an IC socket. Particularly, the present invention relates to an IC socket having a cover member for pressing and holding an IC package, which is mounted on a socket housing.

BACKGROUND

As an example of a conventional IC socket, there is that which is disclosed in U.S. Pat. No. 6,203,332. This IC socket comprises a cover member which is rotatably mounted onto a socket housing at a first end thereof. The cover member presses an IC package, which is placed within an opening of a reinforcing plate within the socket housing. The cover member holds the IC package between it and the socket housing with the applied pressure. A package guide for guiding the IC package is formed on the reinforcing plate.

In the aforementioned conventional IC socket, the guide portion is provided on the reinforcing plate. However, if the IC package is pressed while it is placed on a peripheral wall of the IC socket, the edges of the IC package will grind against the guide portion. This may occur if the IC package is placed at a position shifted from its proper mounting position or if the IC package is moved from its proper mounting position by the cover member, while the IC package is being mounted onto the socket housing. In this state, friction is generated between the IC package and the guide portion. In this case, even if the IC package is pressed with a predetermined pressure, the applied pressure is reduced by the friction. Therefore, there is a possibility that desired contact pressures will not be obtained between the contacts of the IC package and those of the socket housing. As a result, a problem arises that the reliability of the electrical contact between the IC package and the socket housing is reduced.

SUMMARY

The present invention has been developed in view of the above circumstances. It is an object of the present invention to provide an IC socket that is capable of obtaining stable electrical connections between an IC package and a socket housing, even in the case that the IC package is placed at a position shifted from a predetermined position on the socket housing then pressed, during connection of the IC package, or in the case that the IC package is shifted by a cover member during closing of the cover member, without grinding down the peripheral wall of a mounting surface, onto which the IC package is mounted.

An IC socket according to an exemplary embodiment of the present invention comprises a plurality of electrical contacts, an insulative socket housing for holding the electrical contacts arranged substantially in a matrix, and a cover member for pressing an IC package, which is placed on a mounting surface surrounded by a peripheral wall of the socket housing, against the electrical contacts, and for holding the IC package between the cover member and the socket housing in the pressed state. A metal plate for guiding the IC package onto the mounting surface is provided at least a portion of the peripheral wall. The metal plate is of a shape such that it is coplanar with or protrudes upward from the upper surface of the peripheral wall and such that it is coplanar with or protrudes inwardly from the inner surface of the peripheral wall. Here, "peripheral wall" include walls that have portions that do not surround the mounting surface in addition to walls that surround the entire periphery of the mounting surface.

BRIEF DESCRIPTION OF THE DRAWINGS

FIGS. 5A, 5B, and 5C illustrate a metal plate, which is to be attached to a socket housing, wherein FIG. 5A is a plan view, FIG. 5B is a front view, and FIG. 5C is a side view.

DESCRIPTION OF THE EMBODIMENT(S)

Hereinafter, a preferred embodiment of the IC socket according to the present invention will be described with reference to the attached drawings.

Figure 1:
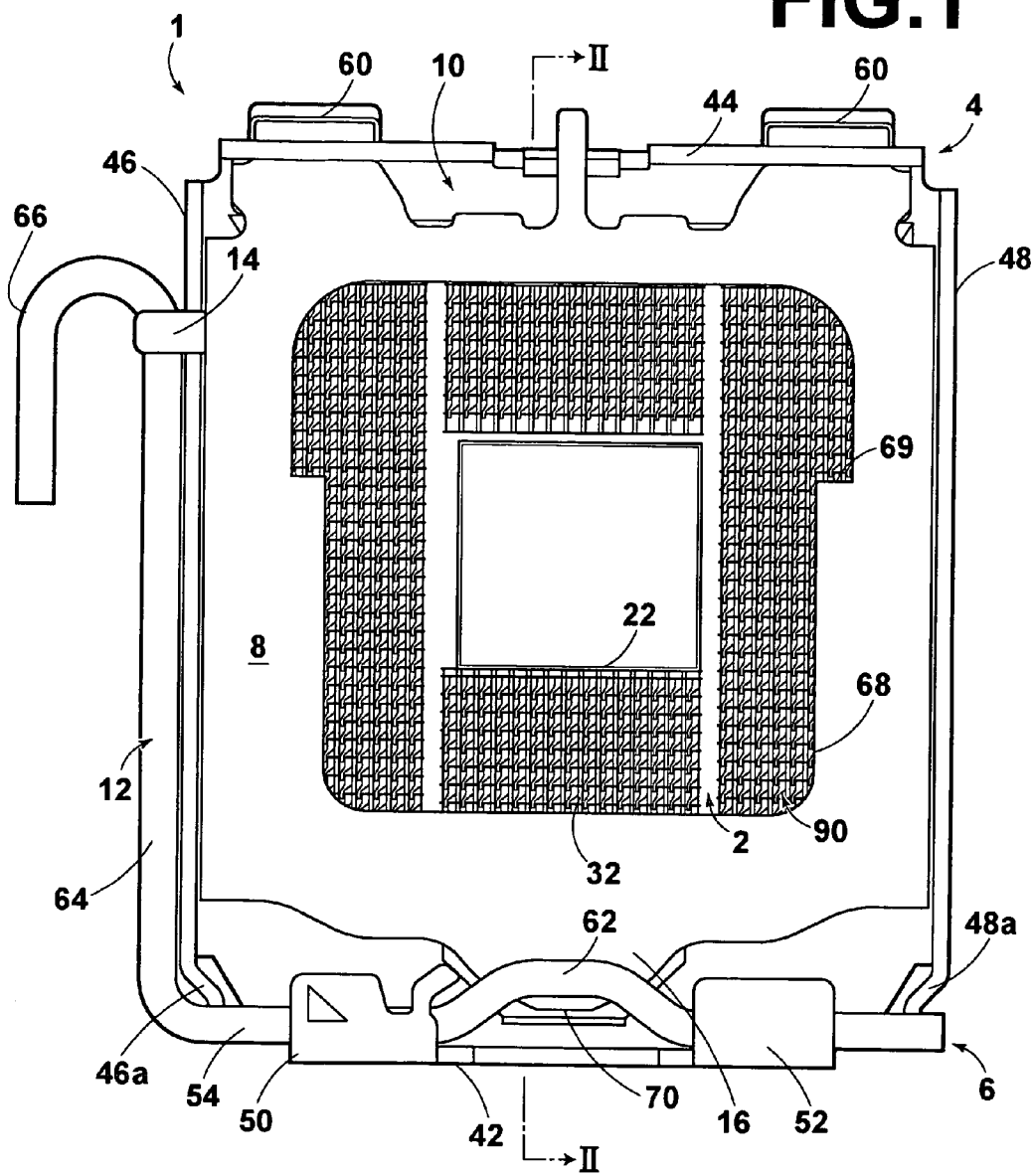
FIG. 1 is a plan view of an IC socket according to an exemplary embodiment of the present invention.
Figure 2:
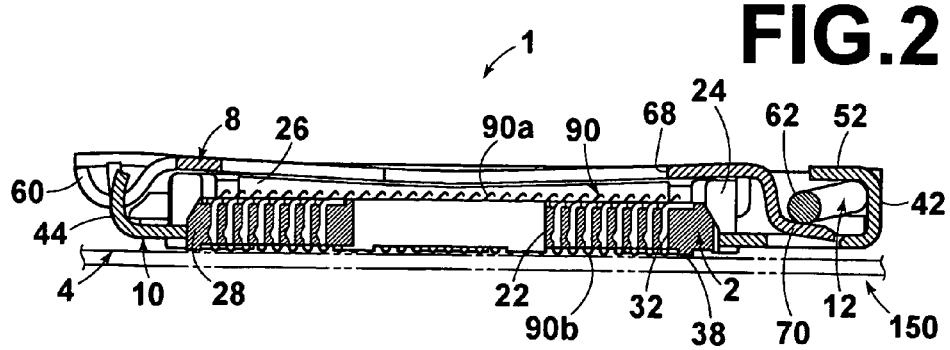
FIG. 2 is a sectional view of the IC socket, taken along line II—II of FIG. 1.

First, the IC socket 1 of the present invention will be described with reference to FIG. 1 and FIG. 2. The IC socket 1 comprises: an insulative socket housing 2, which is formed by molding resin or the like; a cover member 8, which is rotatably mounted toward a first end 4 of the socket housing 2; a metalic reinforcing plate 10 (hereinafter, referred to simply as "reinforcing plate"), which is mounted toward the bottom of the socket housing 3; and a lever 12, which is axially supported toward a second end 6 of the socket housing 2. A substantially rectangular opening 68 is formed in the cover member 8. The lever 12 functions to lock the cover member 8 in its closed state. A plurality of electrical contacts 90 are also provided in the socket housing 2, arranged substantially in a matrix. Note that an IC package 200, which is to be mounted onto the socket hosing 2, is partially illustrated in FIG. 6 and FIG. 7.

Figure 3:
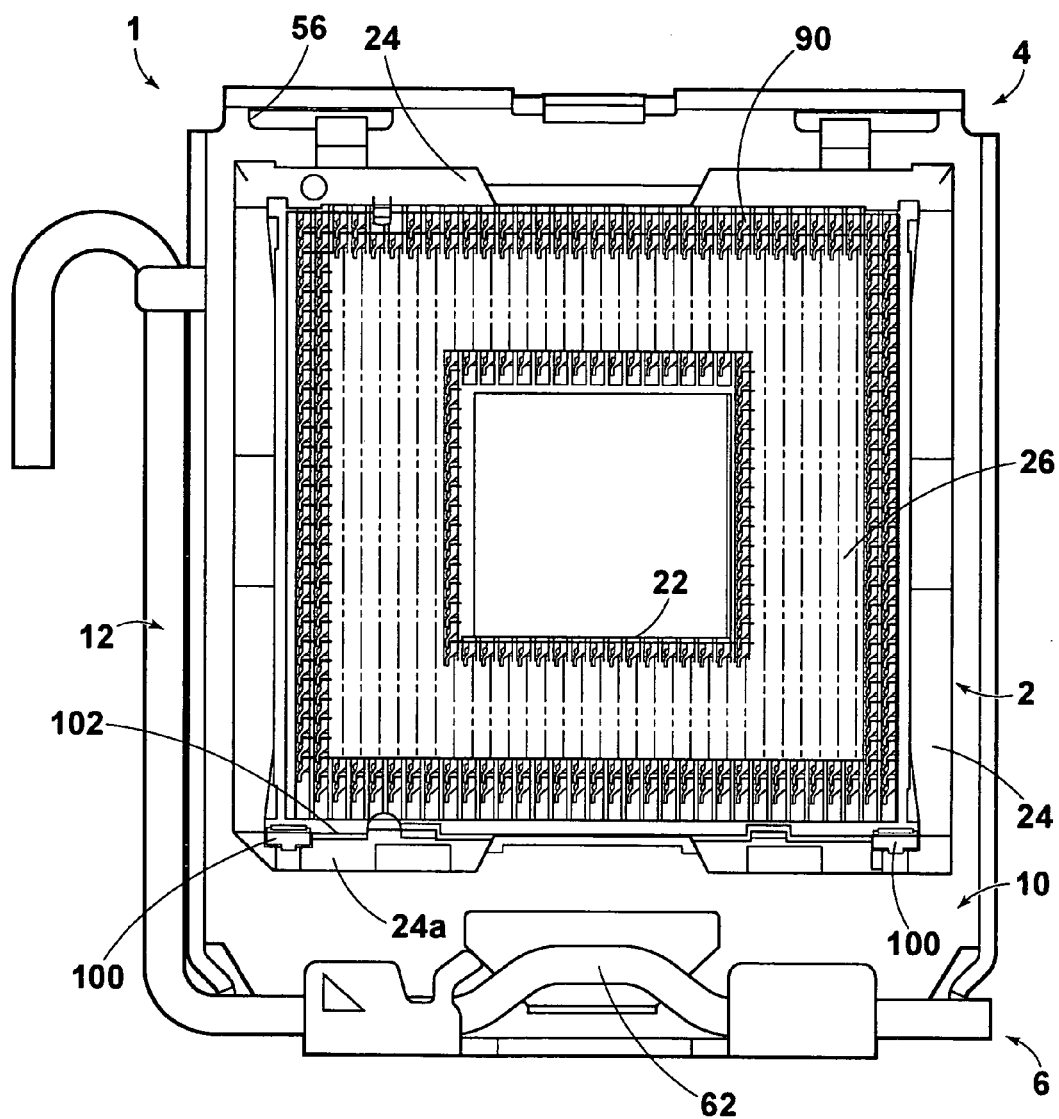
FIG. 3 is a plan view of the IC socket of FIG. 1 with the cover member omitted.
Figure 4:
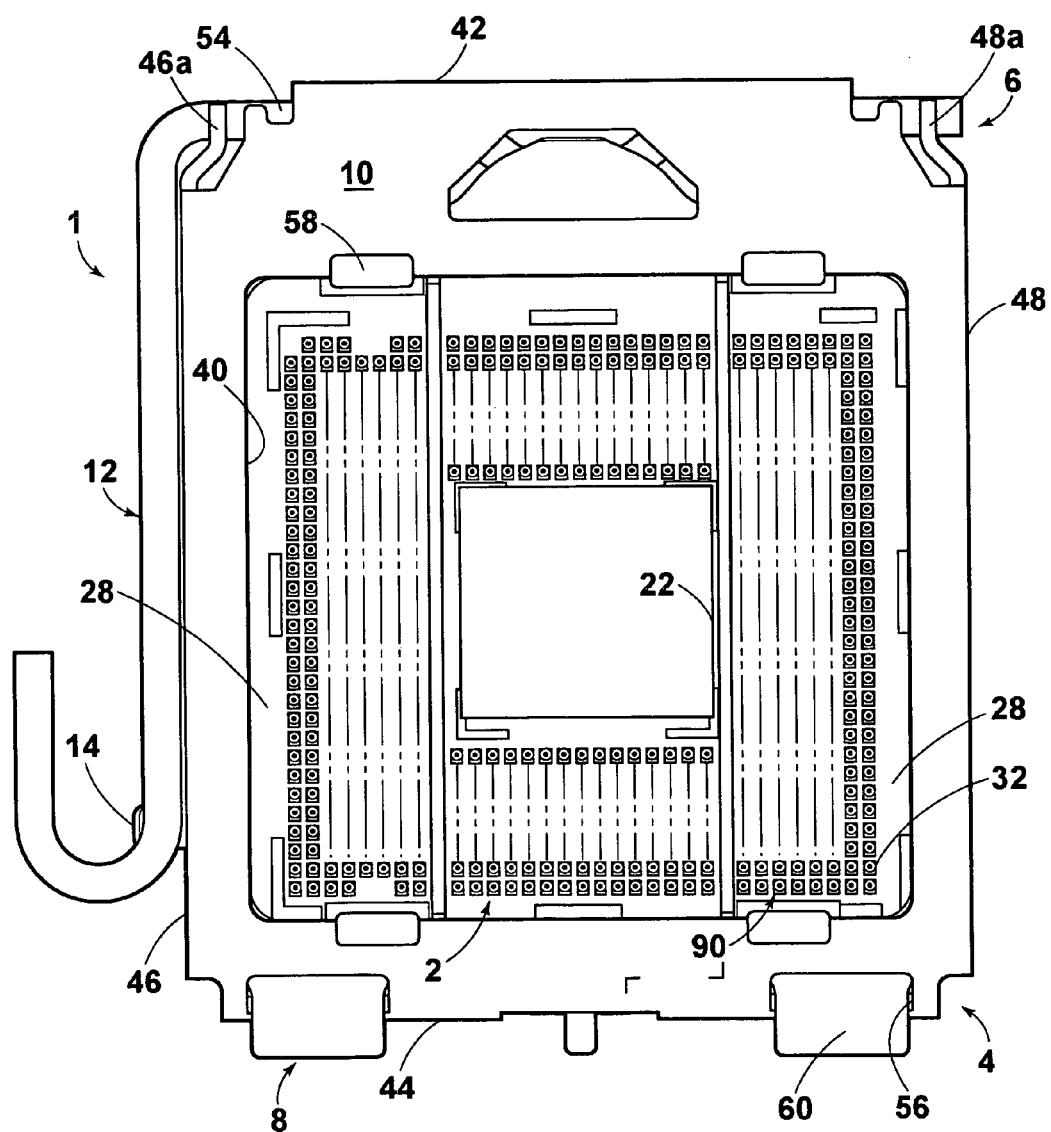
FIG. 4 is a bottom view of the IC socket of FIG. 1.

Next, the socket housing 2 will be described in detail with reference to FIGS. 3 and 4. The socket housing 2 is formed as a rectangular plate having a rectangular opening 22 at its center. A peripheral wall 24, made up by four sides, is erected along the upper peripheral edges of the socket housing 2, to form an IC package receiving portion 26 (shown in FIG. 2), which is open in the upward direction (out of the paper in FIG. 3). A substantially rectangular mounting portion 28 is integrally formed with the socket housing 2 at a lower portion thereof, corresponding to the IC package receiving portion 26. The opening 22 is capable of receiving the IC package 200, which is to be mounted in the IC package receiving portion 26, electronic components, such as capacitors mounted on a circuit board 150, and the like.

Figure 6:
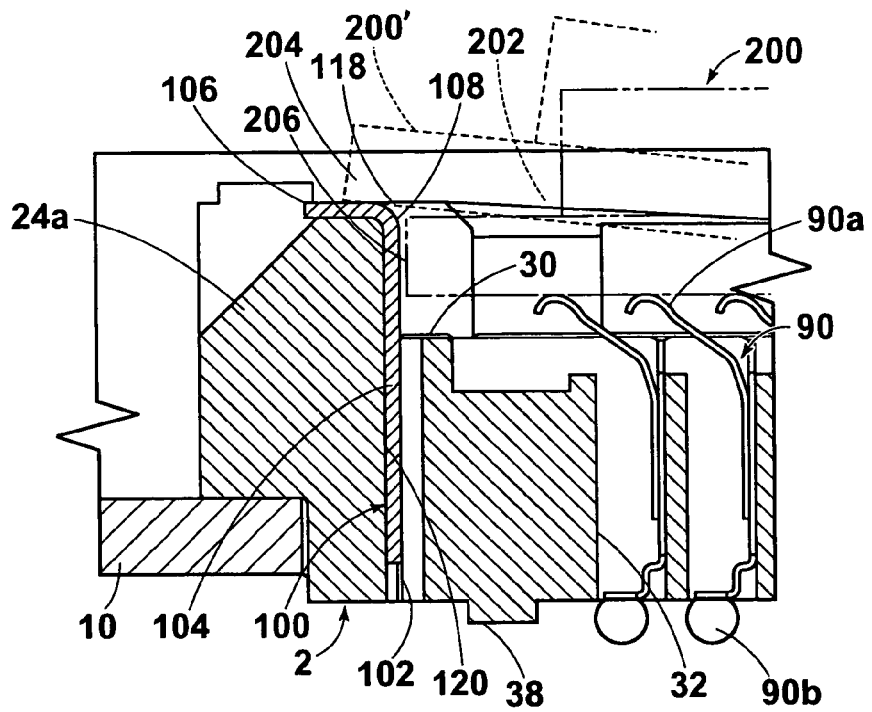
FIG. 6 is a partial magnified view of a state prior to complete mounting of an IC package onto the socket housing of the IC socket of FIG. 1.
Figure 7:
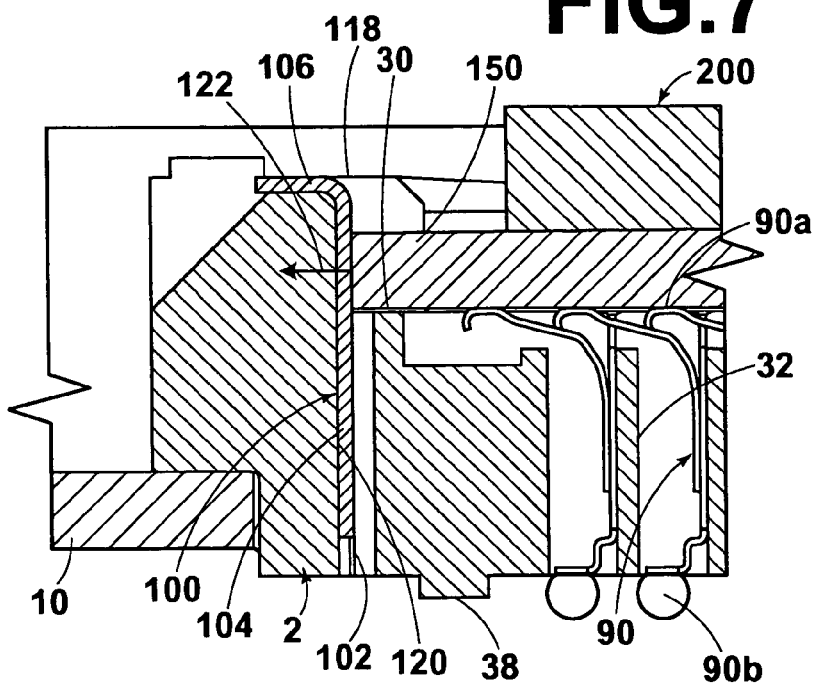
FIG. 7 is a partial magnified view of a state in which the IC package is completely mounted onto the socket housing of the IC socket of FIG. 1.

Electrical contact apertures 32 are formed in a matrix through the bottom surface of the IC package receiving portion 26, that is, an IC package mounting surface 30 (refer to FIG. 6 and FIG. 7). The electrical contact apertures 32 penetrate through the mounting portion 28. The electrical contacts 90 are press fit and fixed within the electrical contact apertures 32. When the electrical contacts 90 are completely mounted within the electrical contact apertures 32, resilient contact pieces 90a protrude from the IC package mounting surface 30, as most clearly illustrated in FIG. 6 and FIG. 7. The contact pieces 90a contact conductive pads (electrical contacts, not shown) of the IC package 200. Meanwhile, solder balls 90b, which are to be soldered onto the circuit board 150, are exposed through the lower surface 38 of the socket housing 2.

Next, the reinforcing plate 10 that supports the socket housing 2 from below will be described in detail. In an exemplary embodiment, the reinforcing plate 10 is formed by punching and bending a single metal plate into a substantially rectangular frame, as illustrated most clearly in FIG. 4. An opening 40, having a shape complementary to that of the mounting portion 28 of the socket housing 2, is formed at the approximate center of the reinforcing plate. The mounting portion 28 is provided within the opening 40, and protrudes downward from the reinforcing plate 10.

The four sides of the reinforcing plate 10 are bending upward, to form a front wall 42, a rear wall 44, and side walls 46 and 48. Holding pieces 50 and 52 (shown in FIG. 1) are integrally formed with the front wall 42, by bending the top of the front wall 42 inward. The holding pieces 50 and 52 are separated from each other in the longitudinal direction of the front wall 42, and function to prevent rotating shafts 54 of the lever 12 from being extracted. Front ends 46a and 48a of the side walls 46 and 48 are positioned beneath the rotating shafts 54 of the lever 12, and cooperate with the holding pieces 50 and 52 to axially support the rotating shafts 54 so that they are rotatable.

Two rectangular openings 56 are formed in the rear wall 44 of the reinforcing plate. The openings 56 are separated from each other in the longitudinal direction of the rear wall 44. Support pieces 60 of the cover member 8 are inserted into the openings 56, to rotatably support the cover member 8. Four protrusions of the socket housing 2 are thermally fused and fixed to the opening 40 of the reinforcing plate 11 by swaging. The swaged portion is denoted by reference numeral 58 in FIG. 4. A laterally protruding engaging protrusion 14 for fixing the lever 12 is formed on the side wall 46 of the reinforcing plate 10 (refer to FIG. 1).

Next, the lever 12 for locking and opening the cover member 8 will be described. In an exemplary embodiment, the lever 12 is formed by bending a single metal wire, and comprises: the spaced rotating shafts 54, which are held by the holding pieces 50 and 52; a crank portion, that is, a locking portion 62, which is positioned between and displaced from the rotating shafts 54; an operating rod 64; and an operating portion 66 for causing the rotating shafts 54 to rotate. The operating rod 64 is bent at a right angle with respect to the rotating shafts 54, in substantially the same direction as the displacement of the locking portion 62. The operating portion 66 is formed by bending the operating rod 64 in a U-shape.

Next, the cover member 8 will be described. Note that in the description, the portion of the cover member 8 positioned toward the first end 4 of the IC socket 1 will be referred to as the "rear", and that the portion of the cover member 8 positioned toward the second end 6 will be referred to as the "front". In an exemplary embodiment, the cover member 8 is formed by punching and bending a single metal plate into a substantially rectangular shape. A locking piece 70, to be pressed and held by the locking portion 62, is formed at the center front portion of the cover member 8. The support pieces 60, which are inserted in the openings 56 of the reinforcing plate 10 to engage therewith, are formed on both lateral sides of the rear portion of the cover member 8. The support pieces 60 curve from below to above in an arcuate shape, in a manner such that the engagement between the support pieces 60 and the openings 56 is not released when the cover member 8 rotates about the engaged portion. Note that the side of the cover member 8 at which the support pieces 60 are formed is referred to as the "axial support side", and that the side of the cover member 8 at which the locking piece 70 is formed is referred to as the "engaging side".

The substantially rectangular opening 68, in which the IC package 200 is to be positioned, is formed at the central portion of the cover member 8. Note that the edges of the opening 68 are curved slightly downward, as illustrated in FIG. 2. This is to facilitate control of the load applied onto the IC package 200 when the cover member 8 presses the IC package 200 against the IC socket 1. Cutouts 69, which are formed in the opening 68 toward the side of the first end 4, are provided to eliminate interference between the cover member 8 and a flange 202 (refer to FIG. 6) of the IC package during closing of the cover member 8. By eliminating the interference, the locking portion 62 and the locking piece 70 are capable of positive engagement.

Next, the metal plate 100, which is mounted onto the socket housing 2, will be described. As illustrated in FIG. 3, a pair of metal plates 100 are mounted on a peripheral wall 24a, which is the portion of the rectangular peripheral wall 24 positioned toward the second end 6. The metal plates 100 extend from the upper surface 118 of the peripheral wall 24a across the inner surface 102 thereof (see FIG. 6). The metal plates 100 are separated in the direction extending along the peripheral wall 24a The metal plates 100 will be described with reference to FIGS. 5A, 5B, and 5C. The state in which the metal plates 100 are mounted onto the socket housing 2 will be described with reference to FIG. 6 and FIG. 7.

Figure 5A:
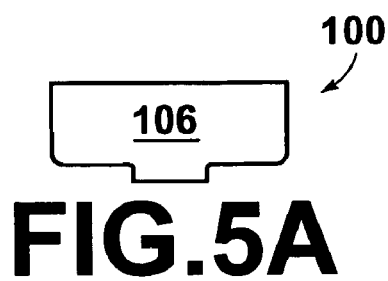
Figure 5B:
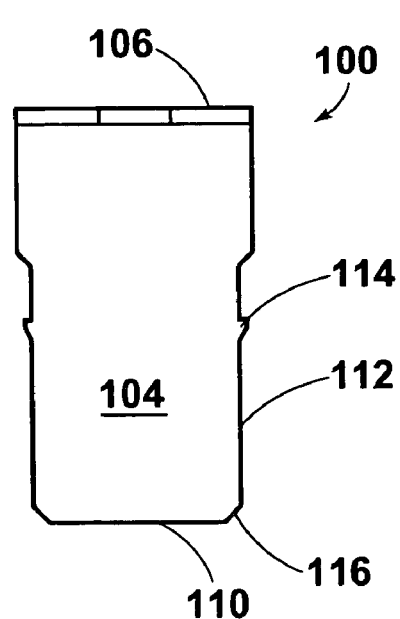
Figure 5C:
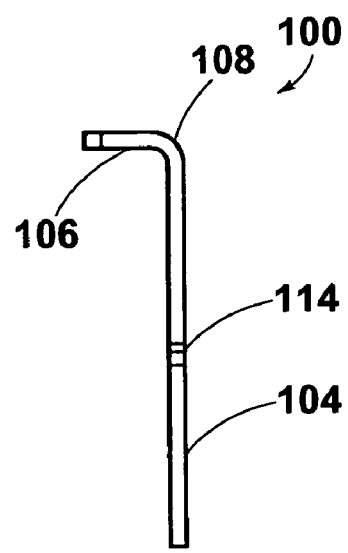

In an exemplary embodiment as illustrated in FIGS. 5A, 5B, and 5C, each metal plate 100 is formed by punching and bending a single metallic plate of stainless steel, a copper alloy or the like. The metal plate 100 has a smooth surface, and comprises: a substantially rectangular main plate portion 104 (vertical portion); a protective plate portion 106 (horizontal portion), which is bent at a right angle with respect to the main plate portion 104; and a curved portion 108 (guide portion) for connecting the main plate portion 104 and the protective plate portion 106. The vicinity of the upper end of the main plate portion 104 is wide. Lateral edges 112 extend downward from the bottom of the wide upper portion to the lower end of the metal plate 100. A barb 114 is formed on each lateral edge 112, and bevels 116 are formed at the lower corners thereof. The protective plate portion 106 is of a substantially rectangular shape, wherein the sides corresponding to the width direction of the metal plate 100 are long, and the sides in the bending direction are short.

Next, the mounted state of the metal plates 100 will be described with reference to FIG. 6. Mounting grooves 120 are formed in the upper surface 118 and the inner surface 102 of the peripheral wall 24a at positions corresponding to the metal plates 100. The mounting grooves 120 are of depths substantially equal to the plate thickness of the metal plates 100, and of shapes complementary thereto. Accordingly, when the metal plates 100 are press fit into the mounting grooves 120, the protective plate portions 106 become substantially coplanar with the upper surface 118, and the main plate portions 104 become substantially coplanar with the inner surface 102. However, the protective plate portions 106 may protrude upward from the upper surface 118, and the main plate portions 104 may protrude inward from the inner surface 102.

Next, mounting of the IC package 200 onto the IC socket 1, constructed as described above, will be described. First, the lever 12 illustrated in FIG. 1 is released from the engaging protrusions 14 and rotated 90° toward the surface of the drawing sheet of FIG. 1. The rotation causes the locking portions 62 of the lever 12 and the cover member 8 to become disengaged, thereby enabling rotation of the cover member 8 about its axial support portion. Then, the IC package 200 is placed on the socket housing 2, as illustrated in FIG. 6. The cover member 8 is closed, the lever 12 is rotated so that the locking portions 62 thereof press and fix the locking pieces 70 of the cover member 8. At this time, the upper surface of the flange 202 of the IC package 200 is pressed by the downwardly curved surface of the cover member 8.

Normally, the IC package 200 is fixed to the socket housing 2 in this manner. However, there are cases in which the IC package 200 is erroneously placed on the socket housing 2 at a position shifted from its proper position. There are also cases in which the IC package 200 is moved during closing of the cover member 8. Referring to FIG. 6, if the cover member 8 (omitted from FIG. 6) is pressed while the IC package, illustrated by broken lines, is in the position denoted by reference numeral 200', downward movement of the edge 204 of the IC package 200 is prevented by the protective plate portions 106 of the metal plates 100. Accordingly, the upper surface 118 is not ground down by the edge 204 of the IC package 200. In addition, if the edge 204 is positioned on the curved portions 108 of the metal plates 100, the IC package 200, which is pressed from above, is guided toward the mounting surface 30 along the curved surfaces of the curved portions 108. Thereby, the IC package is positioned at the position denoted by reference numeral 200.

Then, if the cover member 8 is rotated further downward, an end surface 206 of the IC package 200 moves slightly toward the main plate portions 104 of the metal plates, accompanying the downward movement of the IC package 200. The end surface 206 presses the main plate portions 104 in the direction indicated by arrow 122 of FIG. 7. However, the inner surface 102 of the socket housing 2 is protected by the main plate portions 104 of the metal plates 100. Therefore, the inner surface 102 is not ground down by the IC package. Because the IC package 200 is guided by the main plate portion 104, the IC package descends smoothly into the position illustrated in FIG. 7. At this time, the downward pressure applied to the IC package 200 is not reduced. Therefore, appropriate contact pressure is obtained between the contacts 90 and the IC package 200.

What is claimed is:

1. An IC socket, comprising:
a plurality of electrical contacts;
an insulative socket housing for holding the electrical contacts arranged substantially in a matrix; and
a cover member for pressing an IC package, which is placed on a mounting surface surrounded by a peripheral wall of the socket housing, against the electrical contacts, and for holding the IC package between the cover member and the socket housing in the pressed state; wherein
a metal plate for guiding the IC package onto the mounting surface is provided at least a portion of the peripheral wall; and
the metal plate is of a shape such that it is coplanar with or protrudes upward from the upper surface of the peripheral wall and such that it is coplanar with or protrudes inwardly from the inner surface of the peripheral wall.

2. The IC socket as defined in claim 1, wherein:
a first end of the cover member serves as an axial support end;
the cover member is rotatably mounted on the socket housing such that a second end of the cover member opposite the first end is enabled to contact and separate from the socket housing; and
the metal plate is provided at the peripheral wall toward the second end of the cover member.

3. The IC socket as defined in claim 1, wherein:
the metal plate is provided as a pair of metal plates disposed along the peripheral wall, separated from each other.

4. The IC socket as defined in claim 1, wherein:
the metal plate comprises:
a horizontal portion that extends along the upper surface of the peripheral wall;
a vertical portion that extends along the inner surface of the peripheral wall; and
a guide portion that links the horizontal portion and the vertical portion, for guiding the IC package, which is pressed by the cover member.

5. The IC socket as defined in claim 2, wherein:
the metal plate comprises:
a horizontal portion that extends along the upper surface of the peripheral wall;
a vertical portion that extends along the inner surface of the peripheral wall; and
a guide portion that links the horizontal portion and the vertical portion, for guiding the IC package, which is pressed by the cover member.

6. The IC socket as defined in claim 3, wherein:
the metal plate comprises:
a horizontal portion that extends along the upper surface of the peripheral wall;
a vertical portion that extends along the inner surface of the peripheral wall; and
a guide portion that links the horizontal portion and the vertical portion, for guiding the IC package, which is pressed by the cover member.

7. An IC socket as defined in claim 4, wherein:
the guide portion comprises a curved surface.

8. An IC socket as defined in claim 5, wherein:
the guide portion comprises a curved surface.

9. An IC socket as defined in claim 6, wherein:
the guide portion comprises a curved surface.

* * * * *